(12) United States Patent
Koller et al.

(10) Patent No.: US 7,548,590 B2
(45) Date of Patent: Jun. 16, 2009

(54) METHOD FOR DETERMINING AN OFFSET VALUE FOR A GAIN OF A TRANSMISSION PATH, TRANSMISSION PATH WITH ADJUSTABLE GAIN, AND USE OF THE TRANSMISSION PATH

(75) Inventors: Rainer Koller, Linz (AT); Manfred Haberl, Linz (AT)

(73) Assignee: Infineon Technologies AG, Munich (DE)

( * ) Notice: Subject to any disclaimer, the term of this patent is extended or adjusted under 35 U.S.C. 154(b) by 643 days.

(21) Appl. No.: 11/253,361

(22) Filed: Oct. 19, 2005

(65) Prior Publication Data

US 2006/0098271 A1 May 11, 2006

(30) Foreign Application Priority Data

Oct. 22, 2004 (DE) .................. 10 2004 051 595

(51) Int. Cl.
*H04L 27/00* (2006.01)
*H04L 27/08* (2006.01)

(52) U.S. Cl. .................. 375/295; 375/345; 330/254; 330/278; 455/127.2; 455/127.3

(58) Field of Classification Search ... 455/127.2–127.3; 330/254, 278; 375/295, 345
See application file for complete search history.

(56) References Cited

U.S. PATENT DOCUMENTS

| 7,298,207 B2 * | 11/2007 | Yim et al. .................. 330/133 |
| 7,369,816 B2 * | 5/2008 | Kappes et al. .................. 455/73 |
| 2003/0215033 A1 | 11/2003 | Drapkin et al. |

* cited by examiner

*Primary Examiner*—Curtis B Odom
(74) *Attorney, Agent, or Firm*—Eschweiler & Associates, LLC

(57) ABSTRACT

In a transmission path having two discrete-value adjustable amplifiers, a first amplifier is set with a first gain factor and a second amplifier is set with a second gain factor. A signal is then applied to an input of the transmission path, and a level of a first output signal of the transmission path is ascertained and the second gain factor is altered. The first gain factor is changed in the opposite direction, so that a total gain factor of the transmission path remains substantially the same. The level of an output signal from the transmission path is then ascertained again with the new settings. An offset value is determined by comparing the levels of the first and second signals. As a result, the second amplifier can be calibrated using relative measurements and the first amplifier.

16 Claims, 4 Drawing Sheets

METHOD FOR DETERMINING AN OFFSET VALUE FOR A GAIN OF A TRANSMISSION PATH, TRANSMISSION PATH WITH ADJUSTABLE GAIN, AND USE OF THE TRANSMISSION PATH

REFERENCE TO RELATED APPLICATIONS

This application claims the benefit of the priority date of German application DE 10 2004 051 595.6, filed on Oct. 22, 2004, the contents of which are herein incorporated by reference in their entirety.

FIELD OF THE INVENTION

The invention relates to a method for determining an offset value for a gain of a transmission path. The invention also relates to a transmission path having an adjustable gain and to a use for such a transmission path.

BACKGROUND OF THE INVENTION

Modern communication standards such as UMTS/WCDMA or CDMA2000 place great demands on regulation of the output power from a transmitter. To match the accuracy of an output power or of a sudden change in the output power to the requirements and stipulations of the UMTS standard, it is often desired to implement power regulation in 1-dB steps with an accuracy of 0.1 dB within the transmission path in part of the 70 dB dynamic range of the output signal. Consequently, amplifiers in a transmission path require an accuracy of 0.1 dB for all amplifier settings over a dynamic range from 0 dB to −24 dB of the maximum output power. An error between the actual gain and the nominal gain is meant to be only 0.1 dB in the indicated dynamic range. At the same time, it is necessary to ensure sufficient linearity for the gain in the transmission path over the entire dynamic range.

The demanded linearity and accuracy over the dynamic range can be achieved by voltage controlled amplifiers (VGA, voltage-controlled gain amplifier) only with considerable complexity. For economic reasons, therefore, programmable amplifiers (PGC, programmable gain amplifier) are increasingly used in a transmitter's transmission path. The demanded dynamic range and the current drawn mean that it is also expedient to regulate the gain both in the transmission path's baseband and in the radio-frequency range of the transmission path using the amplifiers therein.

However, production tolerances and environmental influences make it more difficult to achieve the demanded error between the actual gain and the nominally set gain for the radio-frequency amplifiers. Thus, the error is approximately ±0.3 dB instead of the demanded 0.1 dB for radio-frequency amplifiers. A gain can thus be set only to an accuracy of 0.6 dB. For a smaller error, it is therefore necessary to calibrate the amplifier step sizes of the radio-frequency amplifiers in the transmission path.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a method for determining a gain offset value in a transmission path which can be carried out without great additional switching complexity and with sufficient accuracy. The invention also includes a transmission path having an adjustable gain that has sufficient accuracy in the envisaged dynamic range.

The method according to one embodiment of the present invention comprises providing a transmission path having an adjustable total gain, and setting the total gain of the transmission path by setting a first gain and a second gain. A first test signal is supplied to the transmission path and a level of a first output signal associated with the transmission path is ascertained. The second gain is altered by at least one value, and the first gain is altered, so that the total gain factor of the transmission path remains substantially the same. A second test signal is then supplied to the transmission path and a level of a second output signal associated with the transmission path is ascertained, and an offset value for the second amplifier step size is determined by comparing the ascertained levels of the first and second output signals.

In another embodiment of the present invention, the method comprises providing a transmission path having a first discrete-value adjustable amplifier with a first amplifier step size and a second discrete-value adjustable amplifier with a second amplifier step size.

The first amplifier is programmed with a first gain factor and the second amplifier is programmed with a second gain factor, wherein the first and second gain factors forming a first total gain factor. A first test signal is supplied to the transmission path and a level of a first output signal from the transmission path is ascertained. The second gain factor is then altered by at least one second amplifier step size, and the first gain factor is altered, so that the total gain factor remains substantially the same. A second test signal is then supplied to the transmission path and a level of a second output signal associated with the transmission path is ascertained. An offset value for the second amplifier step size is then determined by comparing the ascertained levels of the first and second output signals.

In one example the inventive method does not perform any absolute measurement in order to determine an offset value, but rather only a relative measurement. However, the offset value which has been determined may be used to calibrate the gain of the transmission path, which provides the transmission path with the required accuracy in its actual gain. The relative measurement also diminishes the demands on any measurement devices in terms of their resolution and their dynamic range, which means that low-complexity implementation in the transmission path becomes possible.

The method is suitable particularly when an error between the actual gain and the nominally set gain of the first amplifier is significantly smaller than an error for the second amplifier. The method is accordingly particularly suitable when the two amplifiers have different adjustment accuracies. However, the present invention is not restricted to such applications.

In another embodiment of the invention, it is advantageous if the first adjustable gain is altered in smaller steps than the second adjustable gain. In another embodiment, providing a transmission path also involves providing a power detector and coupling the power detector to an output of the second amplifier. In such example, to determine the offset value, a signal power which is output by the second amplifier is measured.

In one example, the first amplifier is formed by a baseband amplifier which comprises an amplifier step size of 1 dB or less. In one advantageous example, the amplifier step size of the first amplifier is even smaller than 1 dB, for example 0.1 dB. In this example the second amplifier is in the form of a radio-frequency amplifier with a second amplifier step size which is larger than the first amplifier step size.

To determine an offset value, the ascertained level of the first and second output signals is converted into a digital value and the offset of the actual gain from a gain which has been set by a nominal signal is ascertained to form a difference between the two values. The offset can be used to calibrate the transmission path. The remaining inaccuracy or residual error which exists after calibration is dependent on the inaccuracy of a gain setting in the first amplifier, ignoring the measuring instruments for the level measurement.

In one alternative embodiment of the invention, which is particularly simple to implement, the value of the ascertained level of the first output signal is stored. The value of the ascertained level of the second output signal is then compared with the stored value of the level of the first output signal. The first gain factor is altered by at least one first amplifier step size and the level of the second signal is ascertained again. The method is continued until the comparison between the value of the ascertained level of the second output signal and the value of the level of the first output signal gives a different result than the previous comparison. The number of repetitions for the step of alteration is a measure of the offset value.

In accordance with another embodiment of the invention, a transmission path arrangement is provided and comprises a signal input, a control input for gain setting, and a baseband unit that is connected to the signal input and comprises a first discrete-value adjustable amplifier having a control input for gain setting. The path further comprises a second discrete-value adjustable amplifier having a control input for gain setting which has its input side coupled to an output of the baseband unit, and a control unit having a correction input and having a nominal input that is coupled to the control input for setting the gain of the transmission path. The control unit is configured to output a first control signal to the control input of the first amplifier and to output a second control signal to the control input of the second amplifier. The arrangement also comprises a correction unit that is configured to output a correction signal to the correction input in order to compensate for an offset in the gain of the first and second amplifiers, with at least the first control signal being derived from a nominal signal at the nominal input and from the correction signal at the correction input.

The inventive transmission path is thus configured to correct a nominal signal for gain setting with an appropriate correction signal. The correction signal is used to compensate for an offset or an error in the gain of the first and second amplifiers which is caused by fault tolerances and external environmental influences.

In one embodiment of the invention, a power detector is provided which is coupled to the output of the second amplifier via a switching apparatus in one of at least two adoptable switching states of the switching device.

In another embodiment, the output of the power detector has an analog/digital converter connected to it that is connected to the correction unit. This makes it possible to ascertain a correction value for an output signal from the transmission path, which means that it is possible to compensate for an offset even during operation of the transmission path.

In yet another embodiment of the invention, the output of the power detector is connected to a sample and hold circuit and to a first input of a comparison circuit. An output of the sample and hold circuit is in turn connected to a second input of the comparison circuit. An output of the comparison circuit is coupled to the correction unit.

In one example, the first amplifier has a first accuracy in its gain setting which is greater than an accuracy for the gain setting of the second amplifier. The first amplifier accordingly has a smaller error between its actual gain and the nominally set gain than the second amplifier.

The inventive transmission path may be used, for example, in a transmitter for signals based on the UMTS standard or the EDGE standard. The inventive method is also suitable for use in any transmitter which has discrete-value adjustable amplifiers.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail below using exemplary embodiments with reference to the figures, in which.

DETAILED DESCRIPTION OF THE INVENTION

Figure 1:
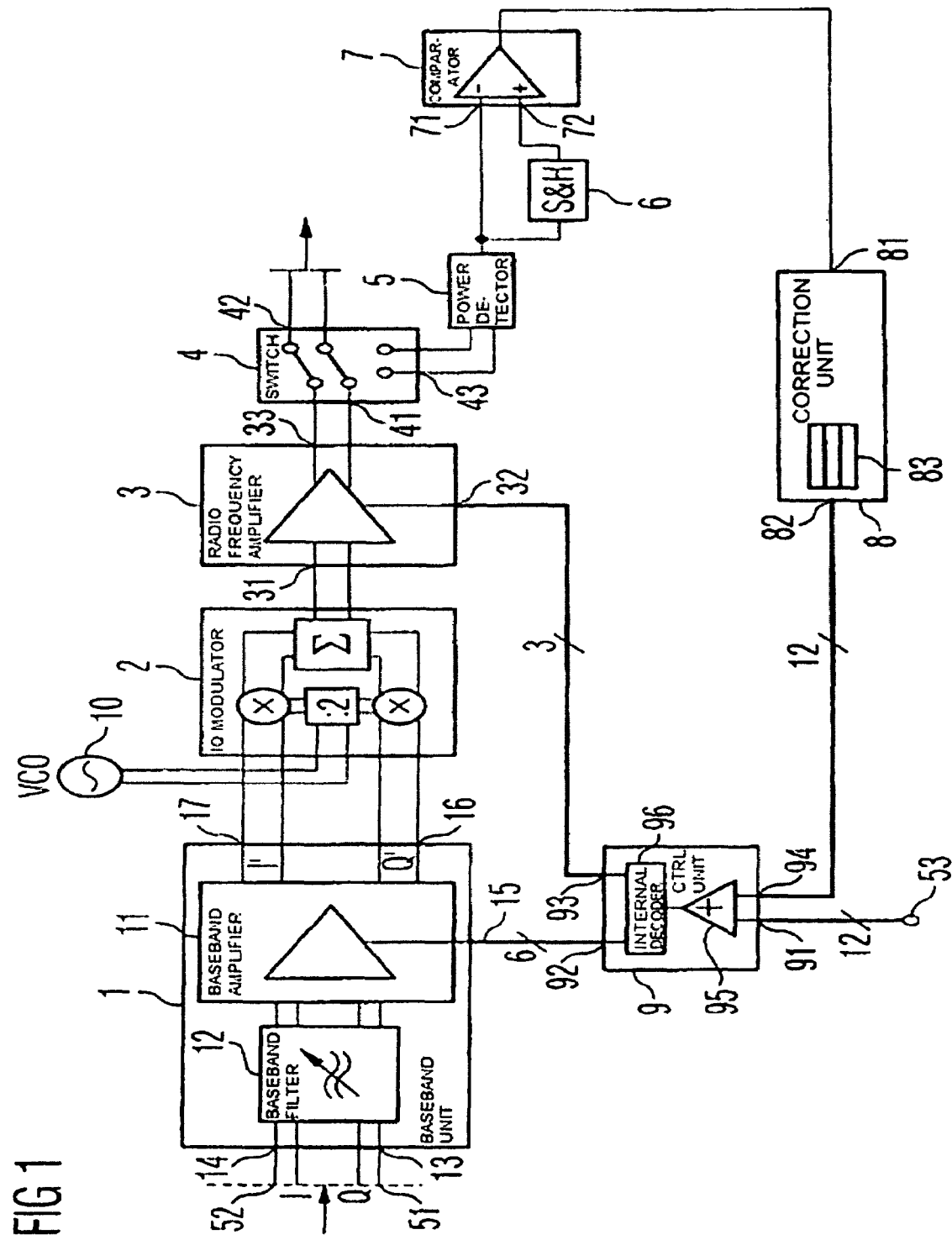
FIG. 1 is a block diagram illustrating a transmission path according to one exemplary embodiment of the invention.

FIG. 1 shows a first exemplary embodiment of an inventive transmission path having an adjustable gain. To control and set the output power, two amplifiers are used in the present exemplary embodiment. A first amplifier 11 is part of a baseband unit 1 and has very high accuracy in its gain setting and hence very high incremental accuracy. By way of example, it is possible, in one example, to produce increments of 1-dB steps in its gain with an accuracy of ±0.025 dB. The error between the actual gain and the nominally set gain between two gain settings is just 0.05 dB with this amplifier.

The term nominally set gain is understood to mean that gain which is prescribed by a control signal at a control input of the amplifier. Variations, component tolerances and other unpredictable influences cause the actual gain to differ from the nominally set gain. The error is production-related and indefinite.

The baseband unit 1 also comprises a baseband filter 12 which is connected upstream of the input of the baseband amplifier 11 and whose inputs are for their part connected to the inputs 14 and 13 of the baseband unit 1. The inputs 14 and 13 of the baseband unit 1 are connected to the signal inputs of the transmission path 52 and 51 for the purpose of supplying an analog signal having a real component I and a quadrature component Q. The filter 12 is used to reject unwanted components which may arise, by way of example, in the components I and Q as artifacts after digital/analog conversion.

The output side of the baseband unit 1 is connected to an IQ modulator 2. The IQ modulator 2 is in the form of a step-up frequency converter. It is used to convert the signal applied to the input side with the two components I and Q to the output frequency using a local oscillator signal provided by a voltage controlled oscillator 10.

In addition to control of the output power by setting the baseband amplifier 11, the output power of the transmission path can also be set using a radio-frequency amplifier 3. In the exemplary embodiment, this is the radio-frequency amplifier 3 whose input 31 is connected via the IQ modulator 2 to the outputs 16 and 17 of the baseband unit 1. The radio-frequency amplifier 3 has a much lower accuracy in its gain setting in comparison with the baseband amplifier 11. By way of example, a gain for the radio frequency amplifier can be set in 6-dB steps only to an accuracy of 0.6 dB. The error between the actual gain of the radio-frequency amplifier 3 and its nominally set gain is thus much greater than the error of the baseband amplifier 11. The accuracy is limited by the fault tolerances and the external environmental influences, which are easier to control in the baseband amplifier 11.

The total accuracy of the gain of the present transmission path is therefore not sufficient, or an error associated therewith is too great. Correction and calibration of the two amplifiers 11 and 3 become necessary when, as in the UMTS standard, for example, a maximum error is prescribed.

To this end, the transmission path contains a switch 4 having two outputs 42 and 43 and also an input 41 which is connected to the output 33 of the radio-frequency amplifier 3. The output 42 of the switch 4 is routed to a radio-frequency antenna (not shown) which is used to radiate the transmitted signal during normal operation. The other output 43 is connected to a power detector 5. The power detector 5 ascertains the power or the level of the signal which is output by the amplifier 3.

On the output side, the power detector 5 is connected to a first input 71 of a comparator 7 and via a sample and hold circuit 6 to a second input 72. An output of the comparator is routed to an input 81 of a correction unit 8. This contains a memory which stores various correction values for the individual gain settings of the transmission path, known as gain steps. This allows an error between the actual gain and a nominally set gain to be taken into account and corrected.

The correction unit 8 has an output 82 which is routed to a correction input 94 of a control unit 9. Besides the correction input 94, the control unit 9 has a nominal input 91 which is connected to the control input 53 of the transmission path. On the output side, the control unit contains a first output 92 which is routed to the control input 15 of the baseband unit 1 and to the baseband amplifier 11. A second output 93 is connected to the control input 32 of the radio-frequency amplifier.

To set the gain, a nominal signal is applied to the input 53. This signal is decoded by the control unit using its internal decoder 96, and two control signals are produced. The first control signal is supplied to the output 93 and is used for coarsely setting the gain of the transmission path by setting the radio-frequency amplifier 3 in 6-dB steps. The second control signal is supplied via the output 92 to the input 15 and hence to the baseband amplifier 11 for the purpose of fine adjustment of the gain in the transmission path. The two control signals are in the form of discrete-value signals.

Component tolerances and external environmental influences mean that particularly the power which is output at the output 33 of the amplifier 3 does not correspond to the nominal value prescribed at the input 53, but rather may differ by up to 0.6 dB. For this reason, the correction unit 8 supplies additional correction values to the input 94 which are added to the nominal value by the control unit 9 and are then evaluated.

In principle, these correction values can be ascertained by measuring the output power using the power detector, converter and calculating a suitable correction value (and such an option is contemplated as falling within the scope of the present invention). However, the demands on the dynamic range of the power detector for direct measurement of the output levels over the demanded dynamic range are very high, which means that implementation is associated with great complexity and cost. In the present example, therefore, no absolute measurement but rather just relative measurements to determine the correction values are therefore performed in order to calibrate the transmission path. This is done, in one example, through intelligent use of the baseband amplifier 11, which has very high incremental accuracy between individual gain factors in comparison with the radio-frequency amplifier, and hence just a small error.

This allows the demand on the dynamic range of the power detector 5 and of a downstream converter to be reduced in suitable fashion. In the present exemplary embodiment, the converter can be replaced by a simple comparator 7 with an upstream sample and hold circuit.

An offset value for the gain, particularly an offset value for the radio-frequency amplifier 3, is determined essentially by two measurement steps in the present example. First, the radio-frequency output 42 is deactivated and the output of the amplifier 33 is connected to the input of the power detector 5. The baseband amplifier 11 and the radio-frequency amplifier 3 are then used to set a total gain for the transmission path. In this case, it is necessary to ensure that a level of an amplified signal is situated within a dynamic range for the power detector 5. Power amplifiers for these purposes may be implemented easily and inexpensively in CMOS technology using a dynamic range from −12 to −20 dBm.

The setting values indicated below are fictitious and greatly simplified for the purpose of better explanation of the principle. They relate to the respective maximum output power of the amplifiers, which is assumed to be of the same magnitude in the example. In addition, it is assumed that all the other components operate without loss. In practice, this would require further adjustments, but ones which do not change the fundamental sequence of the method. The level of an amplified signal should be within the dynamic range of the power detector in order to keep a measurement error in the power detector as small as possible.

When the amplifiers have been set, a signal is applied to the input of the transmission path, the output signal level is measured and the value is buffer-stored in the sample and hold circuit 6. The sample and hold circuit 6 then applies the same signal level to the comparator input 72 of the comparator circuit 7.

In the next step, the gain factor of the radio-frequency amplifier is changed. This is done by raising or lowering the gain by an amplifier step size, for example. At the same time, the gain factor of the baseband amplifier is also changed in the opposite direction, so that the nominal total gain remains the same.

If, by way of example, the nominal gain of the baseband amplifier 11 in the first step was −13 dB and the gain of the radio-frequency amplifier in the second step had been reduced by 6 dB, the nominal gain of the baseband amplifier is increased by 6 dB.

The level or the power of the output signal is then ascertained again using the power detector. Any inaccuracy in the radio-frequency amplifier 3 on account of the different gain factor which has now been set for the radio-frequency amplifier results in a different voltage at the comparator inputs 71 and 72. In the output signal from the comparator, this results in a signal which is supplied to the correction unit 8.

The correction unit now produces a correction signal and outputs it at its output 82. The control unit 9 adds this correction signal at the correction input 94 to the nominal signal at the input 53 and thus produces a new control signal for the baseband amplifier 11. The baseband amplifier 11 then alters its gain, which results in a change in the total gain and hence in a change in the level of the output signal. The level is then measured again and is compared with the value buffer-stored in the sample and hold circuit.

Through fine discrete-value and monotonous alteration of the gain factor for the baseband amplifier it is thus possible to ascertain the offset. This is done by increasing or reducing the gain of the first baseband amplifier by discrete values until there is a change of arithmetic sign in the output signal from the comparator 7. The change of arithmetic sign indicates that the offset in the radio frequency amplifier 3 has been compensated for by the stepwise alteration of the gain factor.

Whenever the gain is increased or reduced, the value which is output by the correction unit 8 is increased or reduced. The number of individual steps before a change of arithmetic sign in the output signal from the comparator gives the error between the actual gain of the radio-frequency amplifier 3 and its nominally set gain.

This error is now known up to an accuracy which corresponds to the accuracy of the baseband amplifier. The ascertained value is stored in the correction unit in order to compensate for the incremental error for this gain setting of the radio-frequency amplifier.

The method can now be repeated with a new gain setting and particularly with a new gain setting for the radio-frequency amplifier 3.

Figure 2:
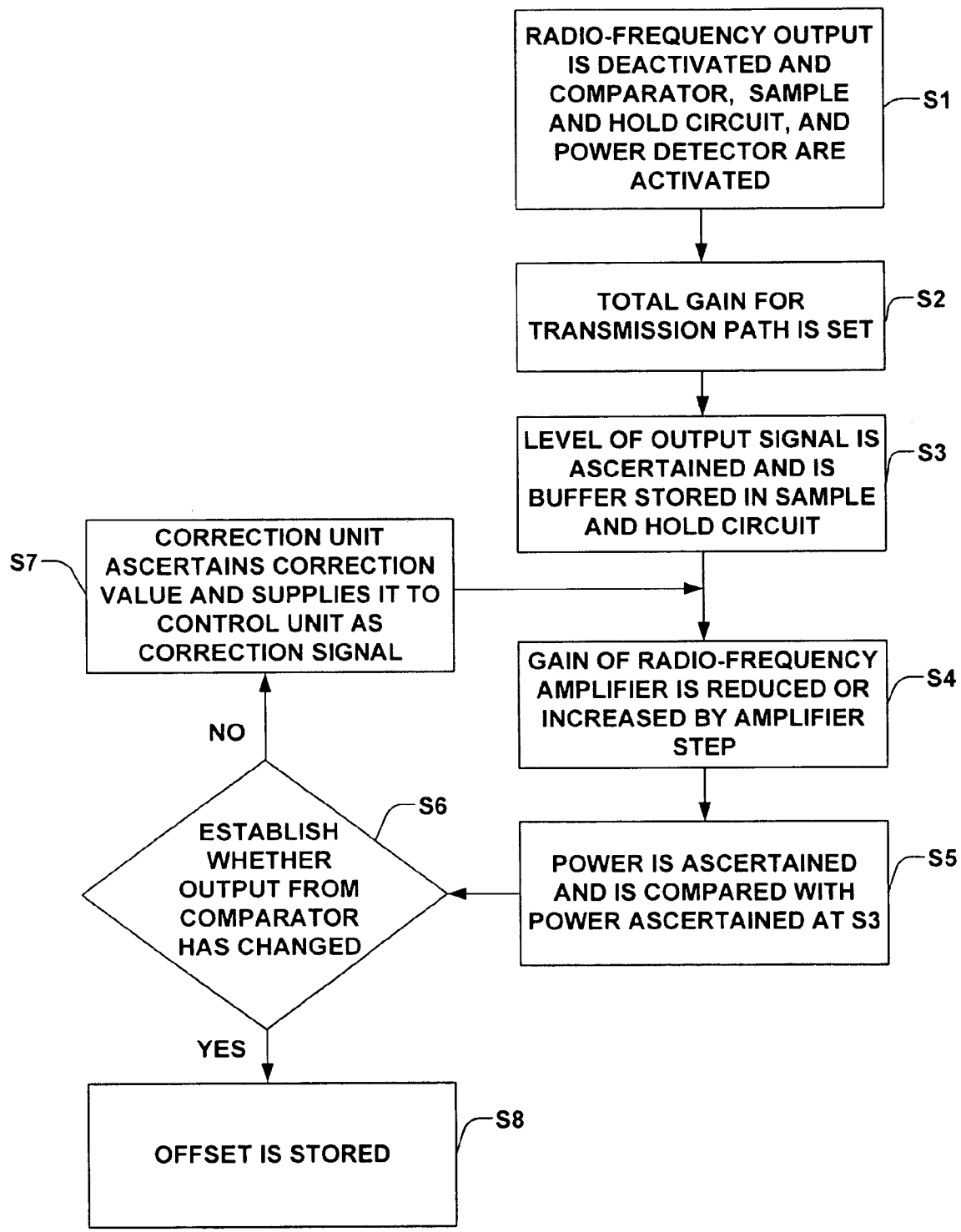
FIG. 2 is a flow chart illustrating a method for determining a gain offset value in a transmission path according to another exemplary embodiment of the invention.

FIG. 2 shows a flowchart of the inventive method. While the exemplary method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

At S1, the radio-frequency output 42 is deactivated and the comparator 7, the sample and hold circuit 6 and the power detector 5 are activated. Deactivating the radio-frequency path is expedient, in one example, in order to prevent transmission while the error or the offset value is being determined. The transmission path is switched to a calibration mode. Depending on the embodiment, it is advantageous to stipulate an internal correction signal in the correction unit 8 as a starting value. This signal can be stored as a correction value in a register. In one example, the value is in the centre of the available range, where fine adjustment in the baseband amplifier 11 is possible. The stipulation in the centre allows faster determination of the offset value later.

In a subsequent act, a total gain for the transmission path is set at S2, so that a level of an output signal is in a dynamic range of the power detector. This is done by separately setting the baseband amplifier and the radio-frequency amplifier using appropriate control signals at the control inputs 15 and 32.

At S3, the level or the power of the output signal is ascertained and is buffer-stored in the sample and hold circuit 6. Next, the second input of the comparator circuit 7 is selected. At S4, the gain of the radio-frequency amplifier is reduced or increased by an amplifier step. In correspondingly opposite fashion, the gain in the baseband amplifier is also lowered or raised, respectively, so that the nominal total gain in the transmission path remains substantially constant. The nominal total gain is to be understood to mean the total gain's nominal value which is set by the nominal signal and which is applied to the input 53 of the transmission path.

At S5, the power is ascertained again and is compared with the power ascertained at S3. At S6, it is established whether the output signal from the comparator has changed, wherein in the present example the output signal is a discrete-value signal with two possible states. In the case of the first measurement, this is not possible, which means that it is possible to skip directly at S7.

At S7, the correction unit 8 ascertains a correction value and supplies it to the control unit 9 as a correction signal. The correction value is raised or lowered by a value in the register each time at S7. In addition, the correction signal causes an alteration in the gain of the baseband amplifier at the correction input. Depending on the search algorithm used, it thus raises or lowers the gain factor of the baseband amplifier 11 by a fine amplifier step. The gain is then set afresh at S4 taking into account the correction signal, and the method is repeated.

If act S6 results in the same comparison value, the method is continued at S7. However, if act S6 ascertains a change in the output signal from the comparator, the value stored in the register corresponds to an offset or else to the error between the actual gain and the nominally set gain. It can therefore be used directly to compensate for the error in the radio-frequency amplifier 3. The offset is stored at S8.

The method can now be continued with a new total gain factor at S2, or the power detector 5 is isolated from the output 33 of the radio-frequency amplifier 3 again. The data which have been obtained and stored in the register of the correction unit can now be used to correct the control signal applied to the input 53 by adding a correction word to the applied control word using, for example, binary addition. As a result, the error in the gain of the radio-frequency amplifier is corrected by a slight gain change in the baseband amplifier.

Figure 3:
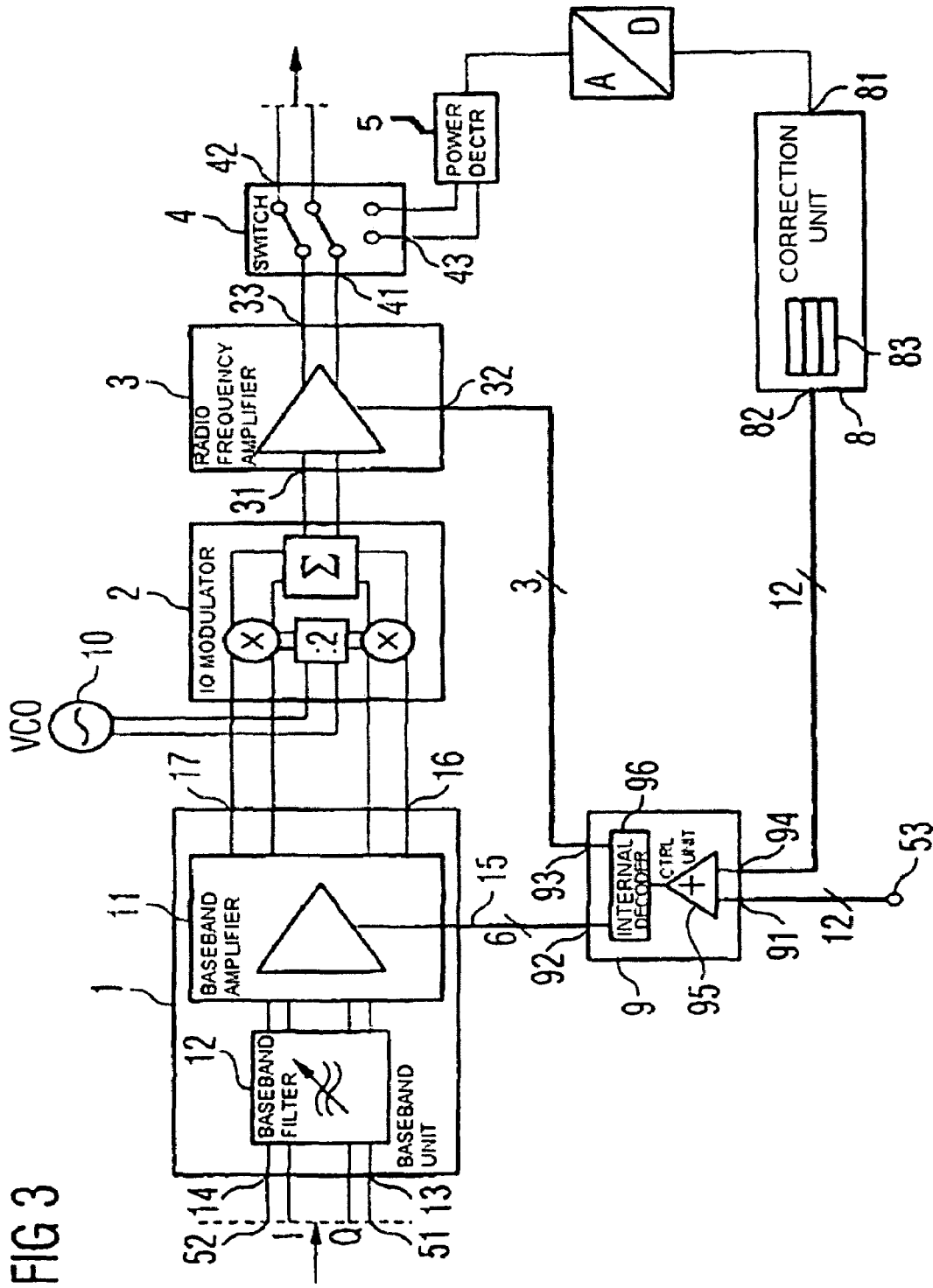
FIG. 3 is a block diagram illustrating a transmission path according to another exemplary embodiment of the invention.

FIG. 3 illustrates a refinement according to an alternative embodiment of the invention. Components which have the same action or function bear the same reference symbols. Instead of the sample and hold circuit 6 used in FIG. 1 and the comparator 7, in this case an analog/digital converter 7a is used which has its input connected to the output of the power detector 5. The analog/digital converter 7a converts the signal applied to its input from the detector 5 into a digital value and supplies the latter to the correction unit 8.

To correct the offset value, it is sufficient in this embodiment to take a measurement twice using different gain factors for the baseband amplifier 11 and for the radio-frequency amplifier 3, where the nominal total gain remains constant. The error or the offset caused by fault tolerances in the radio-frequency amplifier 3 can be determined by forming a difference for the two digital values. The difference can be used further by the correction unit 8 directly.

Figure 4:
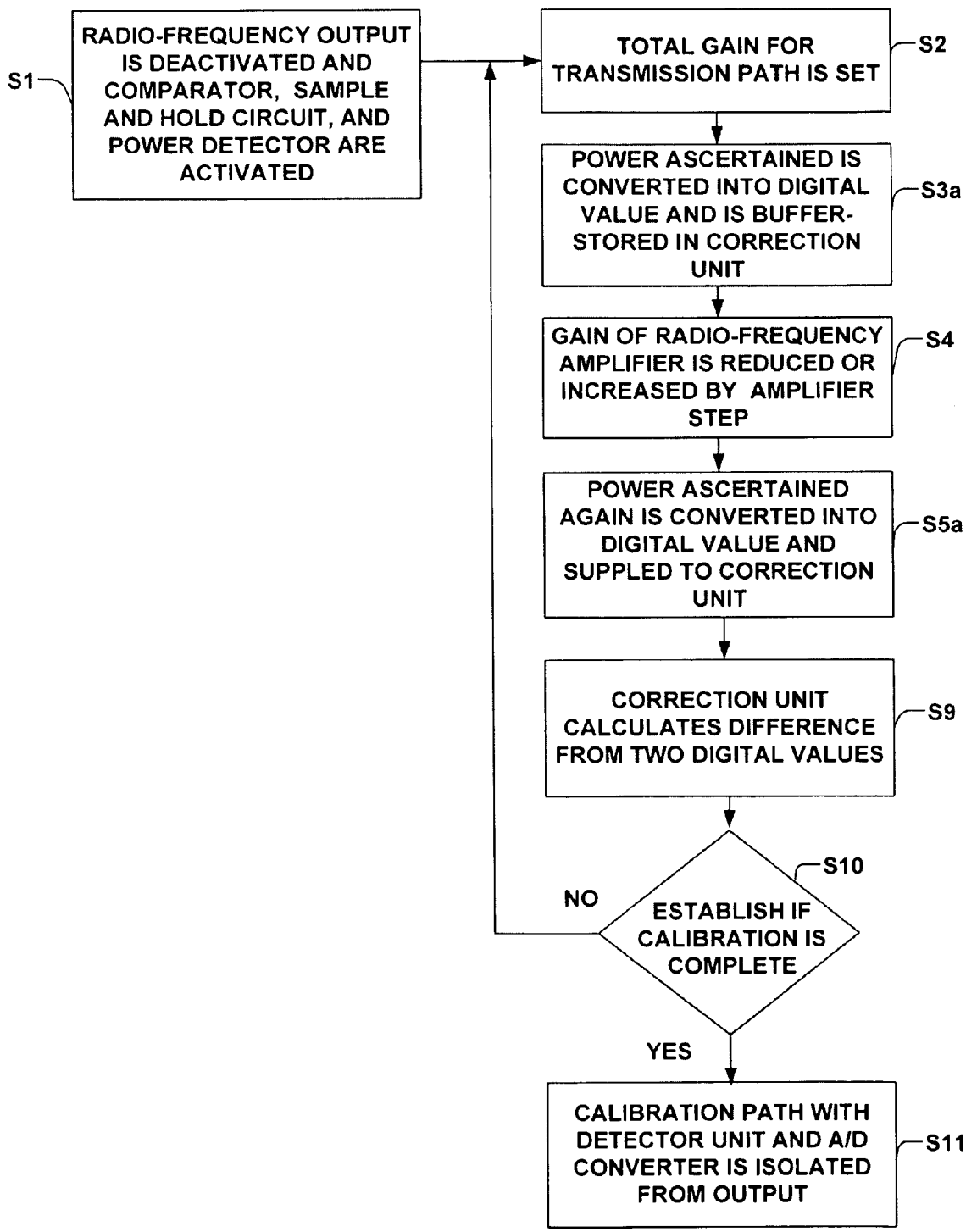
FIG. 4 is a flow chart illustrating another method for determining a gain offset value according to yet another exemplary embodiment of the invention.

Another example embodiment of a method of the present invention is shown in FIG. 4. Following activation of the calibration path at S1, a total gain is set by an appropriate nominal signal at the input 53 at S2. The nominal signal prescribes the corresponding control signals for the baseband amplifier 11 and for the radio-frequency amplifier 3.

At S3a, the power is ascertained, is converted into a digital value and is buffer-stored in the correction unit 8. A new gain is then produced at S4 by a new control signal comprising the nominal signal and the correction signal, and the gain is set. The nominal total gain in the transmission path in turn remains the same.

At S5a, the power is ascertained again, is converted into a digital value and is, in turn, supplied to the correction unit 8. At S9, the correction unit 8 calculates the difference from the two digital values supplied, said difference corresponding to the offset, in order to compensate for the error in the radio-frequency amplifier 3.

If the calibration operation is complete at S10, the calibration path with the detector unit 5 and the analog/digital converter 7a is isolated from the output 33 of the radio-frequency amplifier 3 at S11. The radio-frequency amplifier 3 is now connected to the radio-frequency output 42 again. Alternatively, alignment with a new total gain can be continued at S2.

In this way, it is possible to use a relative measurement to determine an offset for the gain in the transmission path and to correct this offset. In this context, particularly the high accuracy of the baseband amplifier is used, said baseband amplifier being used both to correct the offset in the radio-frequency amplifier 3 and to ascertain this offset value. The method illustrated can be modified in individual steps without altering the inventive method.

The transmission path, in one example, can easily be implemented in a CMOS production process. In addition, this has the advantage that the circuits which are also required such as the power detector, the sample and hold circuit and the comparator are particularly easy to implement therein. The transmission path and the inventive method also allow compensation for aging phenomena and external environmental influences, for example the temperature, even during operation. The method is preferably used in transmitters which are designed to transmit signals based on the UMTS standard, CDMA2000 standard. It can be used in any transmitters which contain programmable amplifiers.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising". In addition, the term "exemplary" as utilized herein merely means an example, rather than the best.

The invention claimed is:

1. A method for determining an offset value for a gain of a transmission path, comprising:
   providing a transmission path comprising a first discrete-value adjustable amplifier with a first amplifier gain step size and having a second discrete-value adjustable amplifier with a second amplifier gain step size;
   setting a first total gain factor for the transmission path by programming the first amplifier with a first gain factor and the second amplifier with a second gain factor, respectively;
   supplying a first test signal to the transmission path and ascertaining a level of a first output signal from the transmission path;
   altering the second gain factor by at least a second amplifier gain step size, and altering the first gain factor so that the total gain factor remains substantially the same as the first total gain factor;
   supplying a second test signal to the transmission path and ascertaining a level of a second output signal from the transmission path; and
   determining an offset value for the second amplifier gain by comparing the ascertained levels of the first and second output signals.

2. The method of claim 1, further comprising:
   storing the offset value in a memory; and
   repeating the actions of claim 1 with a different value comprising a second total gain factor.

3. The method of claim 1, wherein providing the transmission path further comprises:
   providing a power detector configured to ascertain the levels of an output signal associated with the transmission path; and
   coupling an input of the power detector to an output of the second amplifier.

4. The method of claim 1, wherein the first amplifier comprises a baseband amplifier having the first amplifier step size of 1 dB or less, and the second amplifier comprises a radio-frequency amplifier having the second amplifier step size, which is larger than the first amplifier step size.

5. The method of claim 1, wherein determining the offset value comprises:
   converting the ascertained level of the first and second output signals into a digital value; and
   determining a difference between the digital values.

6. The method of claim 1, wherein determining the offset value comprises:
   storing the ascertained level of the first output signal;
   comparing the ascertained level of the second output signal with the stored level of the first output signal;
   altering the first gain factor by a first amplifier step size; and
   ascertaining the level of the second output signal again based on the altered first gain factor.

7. The method of claim 6, further comprising:
   repeating the steps of comparing, altering the first gain factor by a first amplifier step size and fresh ascertainment of the second output signal level until a result of the comparison is different than a result for a previous comparison; and
   ascertaining a number of alteration repetitions.

8. A method for determining an offset value for a gain of a transmission path, comprising:
   providing a transmission path having an adjustable total gain;
   setting an initial total gain of the transmission path by setting a first gain and setting a second gain associated with the transmission path;
   supplying a first test signal to the transmission path and ascertaining a level of a first output signal from the transmission path;

altering the second gain by at least one value, and altering the first gain so that the total gain of the transmission path remains substantially the same as the initial total gain;

supplying a second test signal to the transmission path and ascertaining a level of a second output signal from the transmission path; and determining an offset value for the second gain by comparing the ascertained levels of the first and second output signals.

9. The method of claim 8, wherein the first gain is altered in smaller gain step sizes than the second gain.

10. A transmission path having an adjustable gain, comprising:

a signal input;

a control input configured to set a gain of the transmission path:

a baseband unit connected to the signal input, the baseband unit comprising a first discrete-value adjustable amplifier having a control input for setting a gain thereof;

a second discrete-value adjustable amplifier having a control input for setting a gain thereof, the second discrete-value adjustable amplifier having an input coupled to an output of the baseband unit;

a control unit having a correction input, and a nominal input coupled to the control input of the transmission path, wherein the control unit is configured to output a first gain control signal to the control input of the first amplifier and a second gain control signal to the control input of the second amplifier, wherein at least the first gain control signal is derived from a discrete-value nominal signal at the nominal input and from a correction signal at the correction input; and a correction unit configured to output the correction signal to the correction input of the control unit to compensate for an offset in the gain of the first or second amplifiers, or both.

11. The transmission path of claim 10, further comprising a power detector coupled to an output of the second amplifier via a switching device in one of at least two adoptable switching states of the switching device.

12. The transmission path of claim 11, wherein an output of the power detector is connected to a sample and hold circuit and to a first input of a comparison circuit, and an output of the sample and hold circuit is connected to a second input of the comparison circuit, and an output of the comparison circuit is coupled to the correction unit, and wherein a state of the output of the comparison circuit is selectively indicative of the gain offset of the first and second amplifiers in the transmission path.

13. The transmission path of claim 10, further comprising a step-up frequency converter connected between the output of the baseband unit and the input of the second amplifier.

14. The transmission path of claim 10, wherein the first amplifier has a first amplifier gain step size with a first accuracy and the second amplifier has a second amplifier gain step size with a second accuracy, the first accuracy being greater than the second accuracy.

15. The transmission path of claim 10, wherein the correction unit comprises a memory for storing discrete-value correction values.

16. The transmission path of claim 10, wherein the control unit comprises a summator connected to the nominal input and to the correction input, and a decoder connected downstream of the summator, wherein the decoder is configured to produce the first and second gain control signals from a discrete-value signal which is output by the summator.

* * * * *